United States Patent
Siniscalchi

(10) Patent No.: US 7,116,172 B2
(45) Date of Patent: Oct. 3, 2006

(54) HIGH-SWING FOLDED CASCODE HAVING A NOVEL GAIN-BOOST AMPLIFIER

(75) Inventor: Patrick P. Siniscalchi, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 10/982,744

(22) Filed: Nov. 3, 2004

(65) Prior Publication Data

US 2006/0091952 A1    May 4, 2006

(51) Int. Cl.
*H03F 3/45*    (2006.01)
(52) U.S. Cl. ..................................... 330/260
(58) Field of Classification Search ......... 330/251–261
See application file for complete search history.

(56) References Cited

U.S. PATENT DOCUMENTS 5,365,193 A * 11/1994 Zuffada et al. ............. 330/253
6,177,838 B1 * 1/2001 Chiu ......................... 330/253

* cited by examiner

*Primary Examiner*—Robert Pascal
*Assistant Examiner*—Hieu Nguyen
(74) *Attorney, Agent, or Firm*—J. Dennis Moore; W. James Brady; Frederick J. Telecky, Jr.

(57) ABSTRACT

A circuit topology for gain boosted high-swing folded cascode has been improved to maximize the available dynamic range in applications having low supply voltage requirements. The circuit includes an improved gain boost amplifier that maximizes the available dynamic range for applications having low supply voltage requirements. The improved gain boosting amplifier includes a differential pair of input transistors connected to a current mirror, wherein a pair of current sources supply current to each lead of the current mirror. One lead of the current mirror is level-shifted by a transistor coupled to another current source, wherein the coupling of the transistor and the current source form the output of the amplifier. Effectively, the amplifier consists of a level shifter and a series common-drain, common-gate amplifier. A reduction in transconductance $g_m$ from the series combination is compensated by a current mirror ratio (K:1) between the level shift and the common-drain, common-gate amplifier.

13 Claims, 3 Drawing Sheets

HIGH-SWING FOLDED CASCODE HAVING A NOVEL GAIN-BOOST AMPLIFIER

FIELD OF THE INVENTION

The present invention relates to operational amplifiers and, more particularly, an operational amplifier having a cascode stage that includes an improved gain boosting amplifier.

BACKGROUND OF THE INVENTION

With the trend of power supplies for portable systems continuously decreasing to lower supply voltages, analog designs must be adjusted proportionately to be operable within the lower supply voltage requirement. Of all analog circuit designs, operational amplifiers are a challenge to modify in that an operational amplifier typically requires high open-loop gain and high-frequency response to minimize errors in the output voltage. In addition, operational amplifiers typically require high output swing to maximize the signal-to-noise ratio, especially in low-supply applications. Obtaining high open-loop gain may be achieved by increasing the output resistance. One way to increase output resistance is through the use of a folded cascode. In addition, gain boosting of the cascode devices may enhance the open-loop gain. An increase in output resistance, however, exists often at the expense of output swing. Thereby, in amplifiers that employ gain-boosting of cascode devices to achieve high gain, there exists a problem in achieving a wide output swing near the power supplies without significant complexity or distortion.

Specifically, a simplified version of a cascode (not shown) comprises a top and bottom cascode transistor connected such that the drain of the top couples to the source of the bottom cascode transistor. This simple cascode increases the output resistance by a factor of $g_m r_o$, wherein $g_m$ is the small-signal transconductance and $r_o$ is the small signal output resistance. Thereby, the voltage gain is increased by the same factor. Although a voltage equivalent to the drain-to-source saturation voltage $V_{DS,SAT}$ is necessary to saturate the bottom cascoded transistor, a safety margin voltage $V_{margin}$ is added to ensure that the bottom transistor operates in the saturation region. Thus, taking into account the voltage necessary to keep both cascoded transistors in saturation, the maximum swing from supply is two times the drain-to-source saturation voltage $V_{DS,SAT}$ plus the margin voltage $V_{margin}$. Since the saturation voltage $V_{DS,SAT}$ and the margin voltage $V_{margin}$ are approximately 200 mV, the difference in output swing can be very large with respect to a low power supply. The addition of a gain boosting amplifier increases the output resistance by the additional gain of A, where A is the gain of the amplifier. The output swing limitation, however, further increases by one threshold voltage $V_T$, wherein the output swings to within twice the saturation voltage $V_{DS,SAT}$, the margin voltage $V_{margin}$, and one threshold voltage $V_T$.

Specifically, referring to FIG. 1, amplifiers $A_1$, $A_2$, $A_3$, and $A_4$ amplify the gate inputs of transistors, $MP_3$, $MP_4$, $MN_3$, and $MN_4$, respectively. Amplifiers $A_1$, $A_2$, $A_3$ and $A_4$, provide an increase in the output resistance through boosting the gain of the cascode devices $MP_3$, $MP_4$, $MN_3$ and $MN_4$. Accordingly, the output resistance is increased as is shown in the following equation:

$$r_{out} \approx \frac{1}{g_{ds1} / \frac{(A+1)g_{m3}}{g_{ds3}}}$$

wherein $g_{m3}$ is the small-signal transconductance; and $g_{ds1}$ and $g_{ds3}$ are the transconductance relative to the drain-to-source connection of transistors $MP_1$ and $MP_3$, respectively. Amplifiers $A_1$, $A_2$, $A_3$ and $A_4$, are added in an effort to achieve a high output impedance, wherein the output nodes swing very close to the supply rails. Transistors $MP_3$, $MP_4$, $MN_3$ and $MN_4$, however, shift out of saturation and into the triode region, when these transistors $MP_3$, $MP_4$, $MN_3$ and $MN_4$ should remain in saturation. Initially, when transistors, $MP_3$, $MP_4$, $MN_3$ and $MN_4$, shift into the triode region, the gain and the large output resistance at each output node is lost. In an effort to regain the large output resistance and thereby increase the gain of the operational amplifier, there is a need for a cascode circuit design that keeps transistors, $MP_1$–$MP_4$ and $MN_1$–$MN_4$, biased in saturation.

More particularly, in FIG. 1, amplifier $A_1$ boosts the small-signal transconductance $g_{m3}$ of transistor $MP_3$. Specifically, the source of transistor $MP_3$ couples to an input of amplifier $A_1$ and amplifier $A_1$ couples to receive the bias voltage $V_{bias1}$. The feedback from the source of transistor $MP_3$ guarantees that the source of transistor $MP_3$ will always be equal to voltage $V_{bias1}$. The objective is for the drain-to-source voltages of transistors, $MP_1$ and $MP_3$, to be small and always in saturation. As a result, the output resistance is multiplied by the value of the amplifier A plus one. The objective as explained previously is to bias each cascode transistor such that the outputs, 30 and 32, of the cascode stage are enabled to swing close to either power supply rail. The common-mode feedback circuit 34 controls the common-mode of these differential outputs, 30 and 32.

FIGS. 2A–D display various known simple amplifier designs, 40, 42, 44, and 46. Specifically, the amplifiers, 40 and 42, of FIGS. 2A and 2B include a current mirror transistor pair, $MP_{20}$, $MP_{21}$, $MN_{22}$, and $MN_{23}$, respectively. Input transistors $MN_{20}$ and $MN_{21}$ of amplifier 40 connect to the respective legs of the current mirror transistor pair, $MP_{20}$ and $MP_{21}$. A differential input, $IN_1$ and $IN_2$, couples across the gates of transistors, $MN_{20}$ and $MN_{21}$. Accordingly, an output terminal Out is formed by the drain of both FETs, $MP_{21}$ and $MN_{21}$. A current source $I_1$ couples to the source nodes of FETs, $MN_{20}$ and $MN_{21}$. FIG. 2B illustrates the p-type amplifier 42, wherein the differential input, $IN_3$ and $IN_4$, couples across the gates of transistors, $MP_{22}$ and $MP_{23}$. A current source 12 connects to the source of each transistor, $MP_{22}$ and $MP_{23}$, wherein each transistor couples to a respective leg of the current mirror, $MN_{22}$, and $MN_{23}$.

In the alternative, known amplifier designs, 44 and 46, include current mirrors made from respective transistor pairs, $MN_{24}$, $MN_{25}$, $MP_{24}$ and $MP_{25}$. Specifically, the current mirror, $MN_{24}$ and $MN_{25}$, connects to separate respective inputs instead of connecting to input transistors as is shown in FIGS. 2A and 2B. Current sources $I_3$ and $I_4$ of amplifier 44 connect the current mirror, $MN_{24}$ and $MN_{25}$. FIG. 2D illustrates the n-type transistor amplifier 44 version of the amplifier 46 of FIG. 2C.

Since the amplifier $A_1$ of FIG. 1 must supply voltage to the gate and source of transistor $MP_3$ and the drain of transistor $MP_1$, the source-to-drain voltages of both transistors, $MP_1$ and $MP_3$, must be extremely small to enable that the drain of $MP_3$ to swing close to the supply rail voltage. At the maximum, the drain-to-source voltages of either transistor, $MP_1$ and $MP_3$, may be 400 mV. As a result the inputs of amplifier $A_1$ will be within the range of a few millivolts (mV) away from the supply rail voltage. If, however, each input, $IN_1$ and $IN_2$, of amplifier 40, for example, are 400 mV below the supply rail voltage, there will not be enough headroom for the p-channel mirror, $MP_{20}$ and $MP_{21}$.

One approach to generate an increase in the voltage headroom at the drains of transistors, $MP_{26}$ and $MP_{27}$, is to couple additional transistors $MN_{28}$, $MN_{29}$, $MN_{30}$, and $MN_{31}$, configured as source followers at the inputs or gates of $MN_{26}$ and $MN_{27}$ of amplifier 50 as is shown in FIG. 3. These additional transistors configured as source followers will provide level shifting of the voltage at the drain nodes of each transistor of the current mirror, $MP_{26}$ and $MP_{27}$. The objective is to enable the inputs, $IN_9$ and $IN_{10}$, to be very close to both supply rails. This design, however, is not an efficient one since an additional number of transistors are needed to effectively level shift the voltage. Disadvantageously, these additional transistors do not contribute to the gain of the boosting amplifier.

Some other solutions employ more complex gain-boosting amplifiers for obtaining a wide-swing for the cascode stage. These designs are not efficient, however, due to their complexity. Another simple alternative includes connecting the source of a transistor to the source of the cascode input transistor. This solution, however, can increase distortion when the cascode is used in the signal path such as a folded cascode amplifier.

Thus, there still exists a need for an gain-boosting amplifier design that provides level shifting of the voltages without much complexity. Particularly, this type of implementation is essential in the case where there is a need for high bandwidth within the amplifier design.

The present invention is directed to overcoming, or at least reducing the effects of one or more of the problems set forth above.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

To address the above-discussed deficiencies of low voltage amplifiers, the present invention teaches an operational amplifier having a cascode stage that includes improved gain-boost amplifiers in an effort to increase the voltage headroom within the amplifier to make provision for a wider high-swing for use in low voltage applications. This design maximizes the available dynamic range for applications having low supply voltage requirements. The improved amplifier includes a differential pair of input transistors connected to a current mirror, wherein a pair of current sources supply current to each lead of the current mirror. A transistor, having a source follower configuration, couples between a third current source and the second power supply rail. This transistor is biased by one of the leads of the current mirror. Accordingly, the coupling of the transistor and the current source form the output of the amplifier. Effectively, the amplifier consists of an effective level shift and a series common-drain, common-gate amplifier. A reduction in transconductance $g_m$ from the series combination is compensated by a current mirror ratio (K:1) between the level shift and the common-drain, common-gate amplifier. Specifically, the size of one of the transistors in the differential pair is a multiple integer (K) times the size of the other transistor in the differential pair. In addition, the size of one of the transistors in the current mirror is a multiple integer (K) times the size of the other transistor in the current mirror. Moreover the amount of current supplied by the second current source is a multiple integer (K) times the amount of current provided by the first current source.

In accordance with the principles of the present invention, there is disclosed herein an improved gain boosting amplifier for use in a cascode stage of an operational amplifier. This improved gain boosting amplifier provides more voltage headroom to keep the transistors of the amplifier in saturation particularly when the gain boosting amplifier is used in low voltage applications.

An improved operational amplifier includes an cascode stage coupled between an input stage and an output stage. The cascode stage includes a high swing folded cascode with a pair of gain boosting amplifiers to provide bias on the high-side of the folded cascode and a pair of gain boosting amplifiers that provide bias on the low-side of the folded cascode. One gain boosting amplifier of the pair of high-side gain boosting amplifiers has the same design as the improved amplifier in accordance with the present invention. In addition one gain boosting amplifier of the pair of low-side gain boosting amplifiers has the same design as the improved amplifier in accordance with the present invention.

The advantages include but are not limited to a high swing folded cascode, having an improved gain boosting amplifier that provides level shifting of voltages without much complexity. This enhanced design provides substantial benefit in applications having a need for a high bandwidth amplifier design. This amplifier can provide sufficient gain while allowing the output of the cascode to swing within two saturation voltages $V_{Dsats}$ (approximately twice the difference between the gate-to-source voltage $V_{GS}$ and the threshold voltage $V_T$) of either power supply. This novel gain boosting amplifier uses less transistors than conventional designs while providing more gain than a simple single transistor amplifier with less distortion. Moreover, this amplifier design provides a simple solution that requires less die area. This simplicity allows for wider bandwidths. Through the use of this amplifier design applications that employ gain-boosting of the cascode devices to achieve high gain will be able to achieve wide output swing near the power supplies without significant complexity nor distortion.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
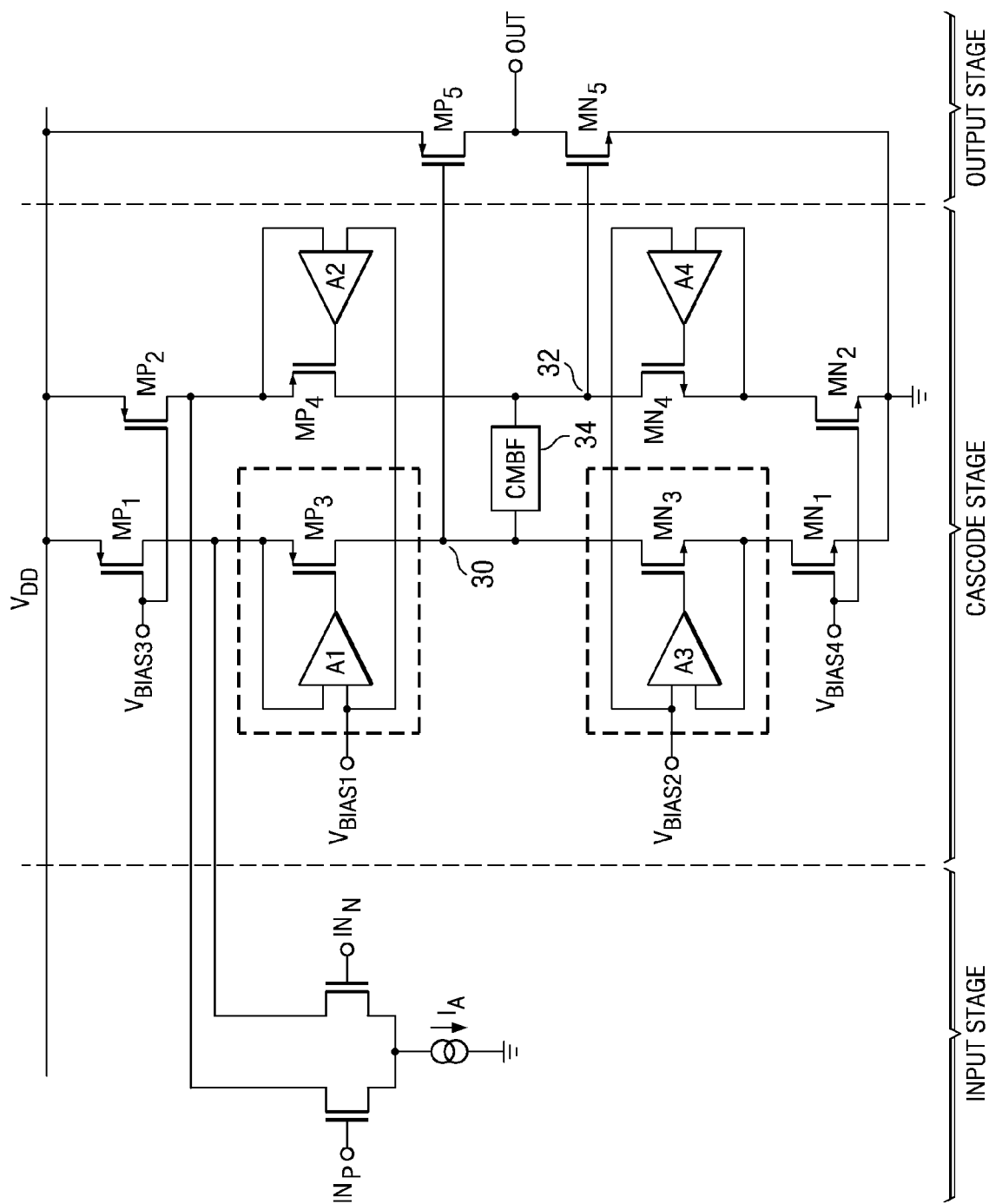
FIG. 1 is a known operational amplifier, having a cascode stage that includes gain boosting amplifiers.
Figure 2A:
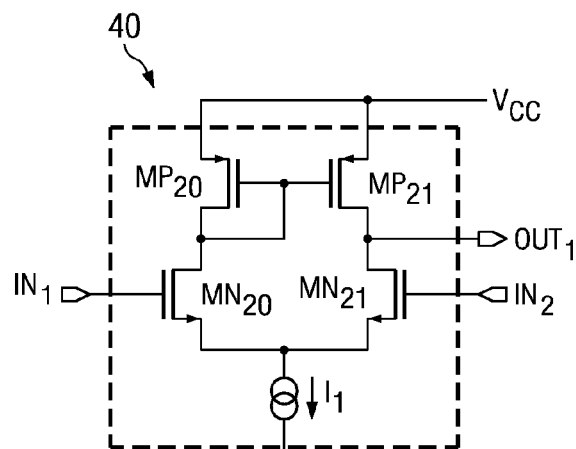
FIGS. 2A, 2B, 2C and 2D illustrate known gain boosting amplifiers.
Figure 2B:
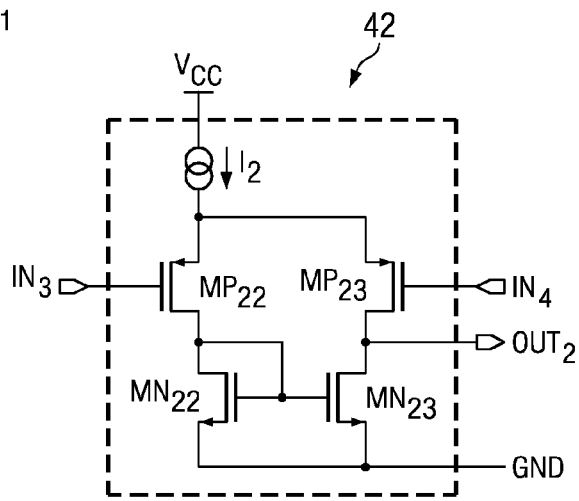
Figure 2C:
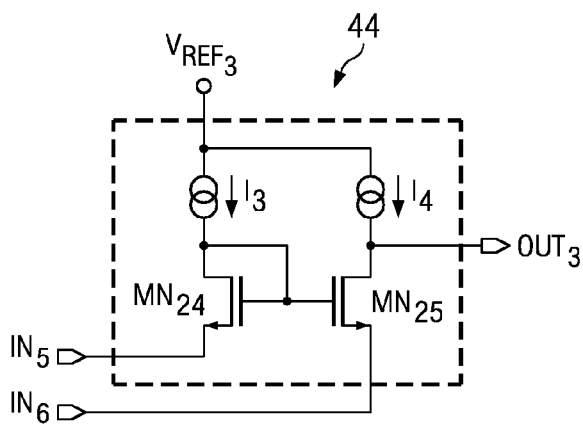
Figure 2D:
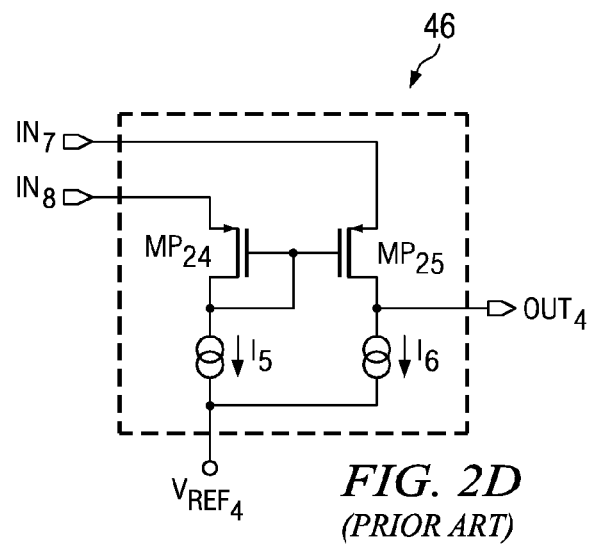
Figure 3:
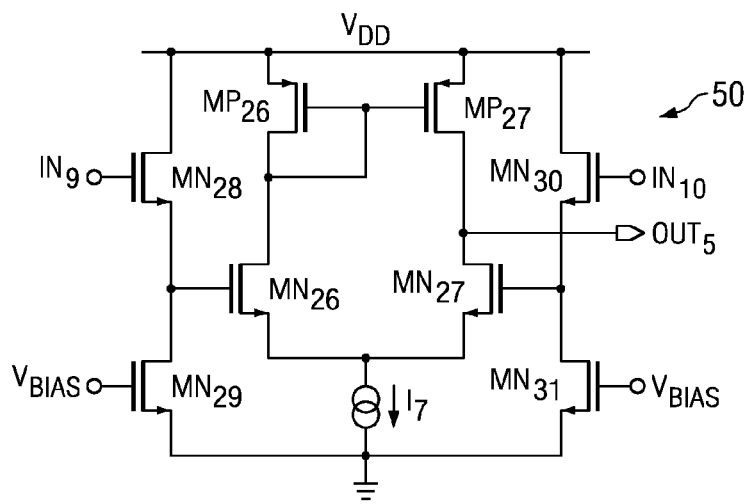
FIG. 3 displays a known enhanced gain boosting amplifier.

One or more exemplary implementations of the present invention will now be described with reference to the attached drawings, wherein like reference numerals are used to refer to like elements throughout. The various aspects of the invention are illustrated below in an improved gain boosting amplifier, although the invention and the appended claims are not limited to the illustrated examples.

The present invention is best understood by comparison with the prior art. Hence, this detailed description begins with a discussion of known gain boosting amplifier design as implemented within an operational amplifier shown in FIG. 1. As explained previously in the Background section, amplifiers $A_1$, $A_2$, $A_3$, and $A_4$ amplify the gate inputs of transistors, $MP_3$, $MP_4$, $MN_3$, and $MN_4$, respectively. Amplifiers $A_1$, $A_2$, $A_3$ and $A_4$, provide an increase in the output resistance through boosting the gain of the cascode devices $MP_3$, $MP_4$, $MN_3$ and $MN_4$. Accordingly, the output resistance is increased as is shown in the following equation:

$$r_{out} \approx \frac{1}{g_{ds1} / \frac{(A+1)g_{m3}}{g_{ds3}}}$$

wherein $g_{m3}$ is the small-signal transconductance; and $g_{ds1}$ and $g_{ds3}$ are the transconductance relative to the drain-to-source connection of transistors $MP_1$ and $MP_3$, respectively. Amplifiers $A_1$, $A_2$, $A_3$ and $A_4$, are added in an effort to achieve a high output impedance, wherein the output nodes swing very close to the supply rails. Transistors $MP_3$, $MP_4$, $MN_3$ and $MN_4$, however, shift out of saturation and into the triode region, when these transistors $MP_3$, $MP_4$, $MN_3$ and $MN_4$ should remain in saturation. Initially, when transistors, $MP_3$, $MP_4$, $MN_3$ and $MN_4$, shift into the triode region, the gain and the large output resistance at each output node is lost. In an effort to regain the large output resistance and thereby increase the gain of the operational amplifier, there is a need for a cascode circuit design that keeps transistors, $MP_1$–$MP_4$ and $MN_1$–$MN_4$, biased in saturation.

More particularly, in FIG. 1, amplifier $A_1$ boosts the small-signal transconductance $g_{m3}$ of transistor $MP_3$. Specifically, the source of transistor $MP_3$ couples to an input of amplifier $A_1$ and amplifier $A_1$ couples to receive the bias voltage $V_{bias1}$. The feedback from the source of transistor $MP_3$ guarantees that the source of transistor $MP_3$ will always be equal to voltage $V_{bias1}$. The objective is for the drain-to-source voltages of transistors, $MP_1$ and $MP_3$, to be small and always in saturation. As a result, the output resistance is multiplied by the value of the amplifier A plus one. The objective as explained previously is to bias each cascode transistor such that the outputs, 30 and 32, of the cascode stage are enabled to swing close to either power supply rail. The common-mode feedback circuit 34 controls the common-mode of these differential outputs, 30 and 32.

Figure 4:
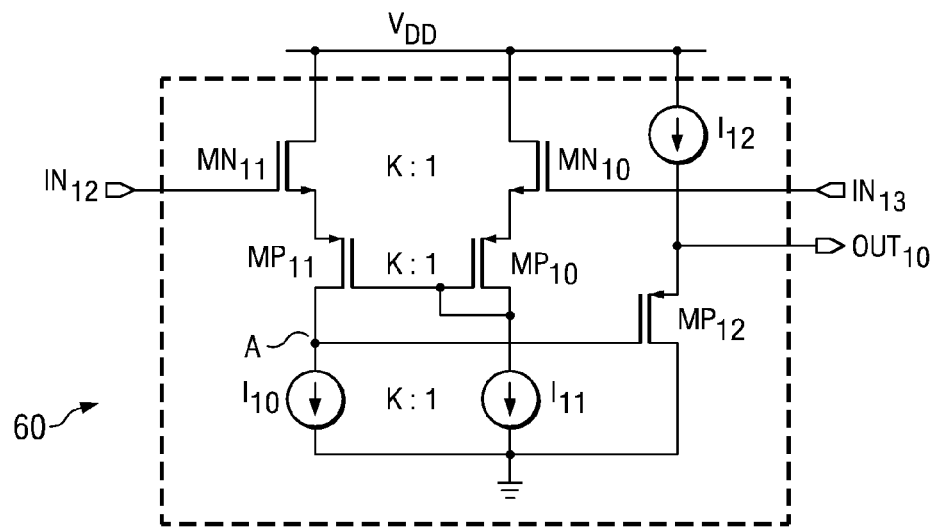
FIG. 4 shows a high-side gain boosting amplifier having N-channel inputs in accordance with the present invention.

FIG. 4 illustrates the novel gain boosting amplifier in accordance with the present invention that may be implemented in the operational amplifier design shown in FIG. 1. This amplifier includes input that will be very close to the power supply rails, wherein the level shifting circuitry of the amplifier does not add much complexity to the design. Specifically, the amplifier of FIG. 4 may substitute in for amplifier A1 in the operational amplifier design illustrated in FIG. 1. As shown, amplifier 60 includes a differential pair of input transistors, $MN_{11}$ and $MN_{10}$, connected to a current mirror, $MP_{11}$ and $MP_{10}$, wherein a pair of current sources, $I_{10}$ and $I_{11}$, supply current to each lead of the current mirror. Transistor $MP_{12}$, having a source follower configuration, couples between a third current source $I_{112}$ and the second power supply rail GND. This transistor $MP_{12}$ is biased by one of the leads of the current mirror at node A. Accordingly, the coupling of the transistor $MP_{12}$ and the current source $I_{112}$ form the output $Out_{10}$ of the amplifier. Effectively, transistor $MP_{12}$ provides the level-shifting feature to move away from the supply rail. Specifically, transistors, $MN_{11}$ and $MN_{10}$, are n-channel transistors. A bias voltage reference $V_{bias1}$ biases the gate of transistor $MN_{11}$ and the feedback from the source of transistor $MP_3$ couples to the gate of transistor $MN_{10}$. This implementation still works when the common-mode of amplifier 60 is located close to the power supply rails. As a result, there will be ample head-room for this amplifier implementation.

Effectively, the amplifier consists of an effective level shift and a series common-drain, common-gate amplifier. A reduction in transconductance $g_m$ from the series combination is compensated by a current mirror ratio (K:1) between the level shift and the common-drain, common-gate amplifier. Specifically, the size of transistor $MN_{11}$ is a multiple integer (K) times the size of the transistor $MN_{10}$. In addition, the size of transistor $MP_{11}$ in the current mirror is a multiple integer (K) times the size of transistor $MP_{10}$. Moreover, the amount of current supplied by current source $I_{10}$ is a multiple integer (K) times the amount of current provided current source $I_{11}$.

In operation, if the voltage at the gate of transistor $MN_{10}$ increases, the source of transistor $MN_{10}$ pulls up and, as a result, the source of transistor $MP_{10}$ pulls up. Furthermore, the gate of transistor $MP_{10}$ pulls up and the gate of transistor $MP_{11}$ pulls up. If the bias voltage $V_{bias1}$ remains the same while the voltage at the source of transistor $MP_3$ pulls up, it will reduce the effective transconductance $g_m$ of both transistors, $MN_{10}$ and $MN_{11}$. Since the gate of transistor $MN_{11}$ is primarily fixed, the gate-to-source voltage $V_{gs}$ of transistor $MP_{11}$ will decrease, which will start to turn transistor $MP_{11}$ off. Both current sources, $I_{10}$ and $I_{11}$, have a ratio of K:1. Accordingly, transistors, $MN_{11}$ and $MP_{11}$, in comparison to transistors, $MN_{10}$ and $MP_{10}$, have a K:1 ratio as well. The voltage at the drain of transistor $MP_{11}$ decreases. Transistor $MP_{12}$ couples in a source follower configuration which will tend to pull down. Accordingly, the gate of transistor $MP_3$ will pull down. Node A is the only high impedance node. Thereby, if there was needed compensation, a capacitor could be placed on this node. The voltage gain of $A_V$ is approximately the gain of the amplifier, as follows:

$$A_V = \left(\frac{g_{meff}}{g_{ds-MP11} + g_{110}}\right)\left(\frac{g_{m-MP12}}{g_{m-MP12} + g_{ds-MP12} + g_{112}}\right) \text{ where}$$

-continued $$g_{meff} = \frac{(g_{m-MP11} + g_{mbs-MP11})(g_{m-MN11} + g_{mbs-MN11})}{(g_{m-MP11} + g_{mbs-MP11} + g_{m-MN11} + g_{mbs-MN11})}$$

$$g_{meff} = K\left(\frac{(g_{m-MP10} + g_{mbs-MP10})(g_{m-MN10} + g_{mbs-MN10})}{(g_{m-MP10} + g_{mbs-MP10} + g_{m-MN10} + g_{mbs-MN10})}\right)$$

The size W/L of each transistor may be varied, wherein W refers to width and L refers to length. In this design, the size W/L of the transistors $MN_{11}$, $MN_{10}$, $MP_{11}$, and $MP_{10}$ are altered to generate greater headroom.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims that follow.

Figure 5:
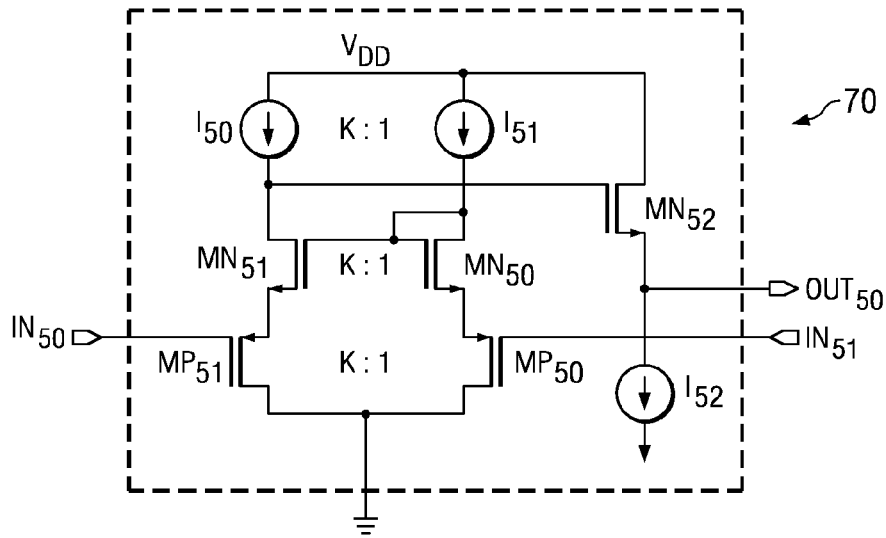
FIG. 5 illustrates a low-side gain boosting amplifier having P-channel inputs in accordance with the present invention.

Those of skill in the art will recognize that the physical location of the elements illustrated in FIGS. 4 and 5 can be moved or relocated while retaining the function described above. For example, Those skilled in the art would recognize that it is possible to increase the gain of the amplifier by increasing the current source and the transistor ratios (i.e. 8:1).

Advantages of this design include but are not limited to a high swing folded cascode, having an improved gain boosting amplifier that provides level shifting of voltages without much complexity. This enhanced design provides substantial benefit in applications having a need for a high bandwidth amplifier design. This amplifier can provide sufficient gain while allowing the output of the cascode to swing within two saturation voltages $V_{Dsats}$ (approximately twice the difference between the gate-to-source voltage $V_{GS}$ and the threshold voltage $V_T$) Of either power supply. This novel gain boosting amplifier uses less transistors than conventional designs while providing more gain than a simple single transistor amplifier with less distortion. Moreover, this amplifier design provides a simple solution that requires less die area. This simplicity allows for wider bandwidths. Through the use of this amplifier design applications that employ gain-boosting of the cascode devices to achieve high gain will be able to achieve wide output swing near the power supplies without significant complexity nor distortion.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An operational amplifier, comprising:
an input stage that is arranged to provide a first current to a first node and a second current to a second node in response to a differential input signal; and
a cascode stage coupled to the input stage, the cascode stage comprises,
  a first transistor coupled between a first power supply and a first node, wherein the first transistor is biased by a first bias voltage,
  a second transistor coupled between the first power supply and a second node, wherein the second transistor is biased by the first bias voltage,
  a third transistor coupled between the first node and a third node,
  a first high-side gain boost amplifier coupled between the first node and a fifth node that couples to receive a second bias voltage, wherein the third transistor is biased by the first high-side gain boost amplifier, the first high-side gain boost amplifier, comprises,
    a first input transistor coupled between the first power supply rail and a first amplifier node, wherein the first input transistor is biased by the first node,
    a second input transistor coupled between the first power supply rail and a second amplifier node, wherein the first input transistor is biased by the fifth node,
    a current mirror coupled between the first and second amplifier nodes, the current mirror comprises a first high-side transistor and a second high-side transistor, the first high-side transistor coupled between the first amplifier node and a third amplifier node, the second high-side transistor coupled between the second amplifier node and a fourth amplifier node, the third amplifier node coupled to bias the first high-side transistor and the second high-side transistor,
    a first current source coupled between the third amplifier node and the second power supply rail,
    a second current source coupled between the fourth amplifier node and the second power supply rail,
    a third high-side transistor coupled between a fifth amplifier node and the second power supply rail, wherein the third high-side transistor is biased by the fourth amplifier node, and
    a third current source coupled between the first power supply rail and the fifth amplifier node, wherein the fifth amplifier node is an output of the first high-side gain boost amplifier,
  a fourth transistor coupled between the second node and a fourth node,
  a second high-side gain boost amplifier coupled between the second node and the fifth node that couples to receive the second bias voltage, wherein the fourth transistor is biased by the second high-side gain boost amplifier,
  a common-mode feedback circuit coupled between the third and fourth nodes to provide a common-mode feedback bias signal,
  a fifth transistor coupled between the third node and a seventh node,
  a first low-side gain boost amplifier coupled between the seventh node and a sixth node that couples to receive a third bias voltage, wherein the fifth transistor is biased by the first low-side gain boost amplifier, a sixth transistor coupled between the fourth node and an eighth node, a second low-side gain boost amplifier coupled between the eighth node and the sixth node that couples to receive the third bias voltage, wherein the sixth transistor is biased by the second low-side gain boost amplifier, a seventh transistor coupled between the seventh node and a second power supply, wherein the seventh transistor is biased by a fourth bias voltage, and a eighth transistor coupled between the eighth node and the second power supply, wherein the eighth transistor is biased by the fourth bias voltage.

2. The operational amplifier as recited in claim 1, wherein the input stage comprising:

a fourth current source coupled between the second power supply and a ninth node;

a ninth transistor coupled between the ninth node and the second node, wherein the ninth transistor is biased by a first portion of the differential input signal; and a tenth transistor coupled between the ninth node and the first node, wherein the tenth transistor is biased by a second portion of the differential input signal.

3. The operational amplifier as recited in claim 1, wherein the first low-side gain boost amplifier comprising:

a third input transistor coupled between the second power supply rail and a sixth amplifier node, wherein the third input transistor is biased by the sixth node, a fourth input transistor coupled between the second power supply rail and a seventh amplifier node, wherein the fourth input transistor is biased by the seventh node, a current mirror coupled between the sixth and seventh amplifier nodes, the current mirror comprises a first low-side transistor and a second low-side transistor, the first low-side transistor coupled between the sixth amplifier node and an eighth amplifier node, the second low-side transistor coupled between the seventh amplifier node and a ninth amplifier node, the ninth amplifier node coupled to bias the first low-side transistor and the second low-side transistor, a fourth current source coupled between the eighth amplifier node and the first power supply rail, a fifth current source coupled between the ninth amplifier node and the first power supply rail, a third low-side transistor coupled between a tenth amplifier node and the first power supply rail, wherein the third low-side transistor is biased by the eighth amplifier node, and a sixth current source coupled between the tenth amplifier node and the second power supply rail, wherein the tenth amplifier node is an output of the first low-side gain boost amplifier.

4. The operational amplifier as recited in claim 1, wherein the first, second, third, and fourth transistors each comprise a P-type field effect transistor, the fifth, sixth, seventh and eighth transistors each comprise an N-type field effect transistor, the first input transistor and second input transistor each comprise an N-type field effect transistor, the first, second, and third high-side transistors each comprise a P-type field effect transistor, the first power supply corresponds to a high power supply and the second power supply corresponds to a low power supply.

5. The operational amplifier as recited in claim 2, wherein the ninth and tenth transistors each comprise a N-type field effect transistor, the first power supply corresponds to a high power supply and the second power supply corresponds to a low power supply.

6. The operational amplifier as recited in claim 3, wherein the first, second, third, and fourth transistors each comprise a P-type field effect transistor, the fifth, sixth, seventh and eighth transistors each comprise an N-type field effect transistor, the third input transistor and fourth input transistor each comprise a P-type field effect transistor, the first, second, and third low-side transistors each comprise an N-type field effect transistor, the first power supply corresponds to a high power supply and the second power supply corresponds to a low power supply.

7. The operational amplifier as recited in claim 1, wherein the size of the second input transistor is a multiple integer (K) times the size of the first input transistor, wherein the size of the second high-side transistor is a multiple integer (K) times the size of the first high-side transistor, and wherein the amount of current supplied by the second current source is a multiple integer (K) times the amount of current provided by the first current source.

8. The operational amplifier as recited in claim 3, wherein the size of the third input transistor is a multiple integer (K) times the size of the fourth input transistor, wherein the size of the first low-side transistor is a multiple integer (K) times the size of the second low-side transistor, and wherein the amount of current supplied by the fourth current source is a multiple integer (K) times the amount of current provided by the fifth current source.

9. A gain boost amplifier for a cascode circuit, comprising:

a first input transistor coupled between a first power supply rail and a first amplifier node, wherein the first input transistor is biased by a first input node;

a second input transistor coupled between the first power supply rail and a second amplifier node, wherein the second input transistor is biased by a second node;

a current mirror coupled between the first and second amplifier nodes, the current mirror comprises a first transistor and a second transistor, the first transistor coupled between the first amplifier node and a third amplifier node, the second transistor coupled between the second amplifier node and a fourth amplifier node, the fourth amplifier node coupled to bias the first transistor and the second transistor;

a first current source coupled between the third amplifier node and the second power supply rail;

a second current source coupled between the fourth amplifier node and the second power supply rail;

a third transistor coupled between a fifth amplifier node and the second power supply rail, wherein the third transistor is biased by the fourth amplifier node; and a third current source coupled between the first power supply rail and the fifth amplifier node, wherein the fifth amplifier node is an output of the first high-side gain boost amplifier.

10. The gain boost amplifier as recited in claim 9, wherein the first input transistor and second input transistor each comprise an N-type field effect transistor, the first, second, and third transistors each comprise a P-type field effect transistor, the first power supply corresponds to a high power supply and the second power supply corresponds to a low power supply.

11. The operational amplifier as recited in claim 10, wherein the size of the second input transistor is a multiple integer (K) times the size of the first input transistor, wherein the size of the second high-side transistor is a multiple integer (K) times the size of the first high-side transistor, and wherein the amount of current supplied by the second current source is a multiple integer (K) times the amount of current provided by the first current source.

12. The gain boost amplifier as recited in claim 9, wherein the first input transistor and second input transistor each comprise a P-type field effect transistor, the first, second, and third transistors each comprise an N-type field effect transistor, the first power supply corresponds to a low power supply and the second power supply corresponds to a high power supply.

13. The operational amplifier as recited in claim 12, wherein the size of the second input transistor is a multiple integer (K) times the size of the first input transistor, wherein the size of the second transistor is a multiple integer (K) times the size of the first transistor, and wherein the amount of current supplied by the second current source is a multiple integer (K) times the amount of current provided by the first current source.

* * * * *